United States Patent [19]
Chen et al.

[11] Patent Number: 4,905,073
[45] Date of Patent: Feb. 27, 1990

[54] INTEGRATED CIRCUIT WITH IMPROVED TUB TIE

[75] Inventors: Min-Liang Chen, Lower Macungie Township, Lehigh County; Chung W. Leung, South Whitehall Township, Lehigh County; Daniel M. Wroge, Allentown, all of Pa.

[73] Assignee: AT&T Bell Laboratories, Murray Hill, N.J.

[21] Appl. No.: 376,919

[22] Filed: Jul. 3, 1989

Related U.S. Application Data

[63] Continuation of Ser. No. 65,235, Jun. 22, 1987, abandoned.

[51] Int. Cl.[4] .............................................. H01L 23/48
[52] U.S. Cl. .......................................... 357/67; 357/86; 357/42; 357/23.1
[58] Field of Search ................ 357/42, 86, 67 S, 71 S, 357/23.1

[56] References Cited

U.S. PATENT DOCUMENTS

| | | | |
|---|---|---|---|
| 4,435,896 | 3/1984 | Parillo et al. | 29/571 |
| 4,510,670 | 4/1985 | Schwabe et al. | 357/71 S |
| 4,621,276 | 11/1986 | Malhi | 357/42 |
| 4,647,956 | 3/1987 | Shrivastava et al. | 357/42 |
| 4,683,488 | 7/1987 | Lee et al. | 357/42 |

FOREIGN PATENT DOCUMENTS 0183032 4/1986 European Pat. Off. ................ 86/23

OTHER PUBLICATIONS

*Semiconductor International*, "Silicide Technology Spotlight", by Pieter Burggraff, May 1985.
"Titanium Disilicide Self-Aligned Source/Drain+-Gate Technology" 1982 IEEE, IEDM 82, pp. 714–717, C. K. Lau, Y. C. See, D. B. Scott, J. M. Bridges, S. M. Perna and R. D. Davies VLSI Laboratory/Semiconductor Group CMOS division, Texas Inst.
"Titanium Nitride Local Interconnect Technology for VLSI", IEEE 1987, vol. ED-34, No. 3, Mar. 1987, pp. 682–687, Thomas E. Tang, Che-Chia Wei, Roger A. Haken, Thomas C. Holloway, Larry R. Hite, and Terence G. W. Blake.

*Primary Examiner*—Andrew J. James
*Assistant Examiner*—Mark Prenty
*Attorney, Agent, or Firm*—James H. Fox

[57] ABSTRACT

When making CMOS logic circuits, for example an inverter, it is frequently necessary to connect the sources of the p and n channel transistors to their respective tubs (n and p, respectively). The prior art required either a large contact window covering both source and tub regions, or else two standard size contact windows. The present technique forms the tub tie connection by the use of the same silicide layer that is formed on the source/drain regions, which typically also forms a gate silicide in the self-aligned silicide (i.e., "salicide") process. A conventional window may then be used to connect the silicide tub tie (and hence the source/tub regions) to a power supply conductor. A space saving is obtained, and increased freedom for placing the power supply contact window is obtained.

13 Claims, 1 Drawing Sheet

INTEGRATED CIRCUIT WITH IMPROVED TUB TIE

This application is a continuation of application Ser. No. 065,235, filed on June 22, 1987, and now abandoned.

BACKGROUND OF THE INVENTION

1. Field of the Invention

The present invention relates to an improved technique for connecting integrated circuit transistors to the doped semiconductor regions in which they are formed, and the integrated circuits formed thereby.

2. Description of the Prior Art

In the design of integrated circuits employing field effect transistors, it is frequently necessary to electrically connect a source electrode to the doped semiconductor region in which it is formed. A doped semiconductor region in which transistors are formed, and having a different doping level or type than the semiconductor substrate (or epitaxial layer thereon) in which it is formed, is referred to as a "tub". For example, in complementary field effect device technology, (e.g., CMOS), the p-channel transistors may be formed in a n-tube connected to the positive power supply voltage ($V_{DD}$), and the n-channel transistors may be formed in a p-tub connected to the negative power supply voltage ($V_{SS}$). The sources of the p- and n-channel transistors are then electrically connected to their respective tubs, in order to receive their respective power supply voltages. One process for forming both p-tubs and n-tubs is disclosed in U.S. Pat. No. 4,435,896 coassigned with the present invention, with others also being known in the art. Furthermore, in some processes, only a single type of tub region is present, being of the opposite conductivity type as the substrate region in which it is formed. Then, the transistors of one conductivity type are formed in the tubs, and the transistors of the opposite conductivity type are formed in the surrounding substrate region. In either the twin tub or the single tub case, the electrical connection between the source and the tub in which it is formed is referred to as a "tub tie".

In order to provide a tub-tie, the prior art provides for opening two contact windows in the dielectric layers overlying both the source region and an adjacent portion of the tub. A low-resistance conductive link, typically aluminum, is then deposited so as to overlie the dielectric material between the windows, and extends into the windows to contact both the source and tub regions. However, this technique requires that space on the integrated circuit be provided for the two contact windows, which is typically greater than the space otherwise required for the device fabrication. An alternative prior art technique utilizes one large contact window, rather than two normal size windows. The large single window provides an opening over both the source and tub regions. A single conductive plug, typically aluminum, is then deposited into the window, thereby electrically connecting the two regions at the bottom of the window. However, this has the disadvantage that the window must be made large enough to ensure that it overlaps both the source and substrate. Typically more area is again required for layout of the circuit than if the tub tie were not present. Furthermore, the nonstandard size window complicates the use of computer aided design layout techniques. Therefore, the use of a large single contact window is usually reserved for hand-packed circuit layouts. In the foregoing techniques, to reduce the contact resistance, a more highly doped tub contact region is formed in the tub, before forming the tub tie. For example, a n+ doped region is provided in an n tub, and the contact window opened over the tub contact region, with the tub tie conductor then being deposited.

It is known to decrease the contact resistance to source/drain regions, as well as to the gate electrode, by forming a silicide surface layer thereon. This may be accomplished in a single operation by the so-called "salicide" process, by reacting a refractory metal (e.g., titanium) with the exposed silicon of the source/drain regions, as well as the polysilicon gate electrode; see, for example, "Titanium disilicide self-aligned source/drain+gate technology", C. K. Lau et al, *IEDM Technical Digest*, pp. 714–717 (1982).

SUMMARY OF THE INVENTION

We have invented a technique for forming an electrical connection between a field effect transistor source region and the doped silicon semiconductor tub region in which it is formed. A metal silicide layer is formed on both the source region and a tub contact region during the same process that forms the metal silicide on the drain and gate. A dielectric layer may be deposited onto the silicide layer, and a window may be formed therein for connecting the source and tub regions to a power supply conductor.

DETAILED DESCRIPTION

Figure 1:
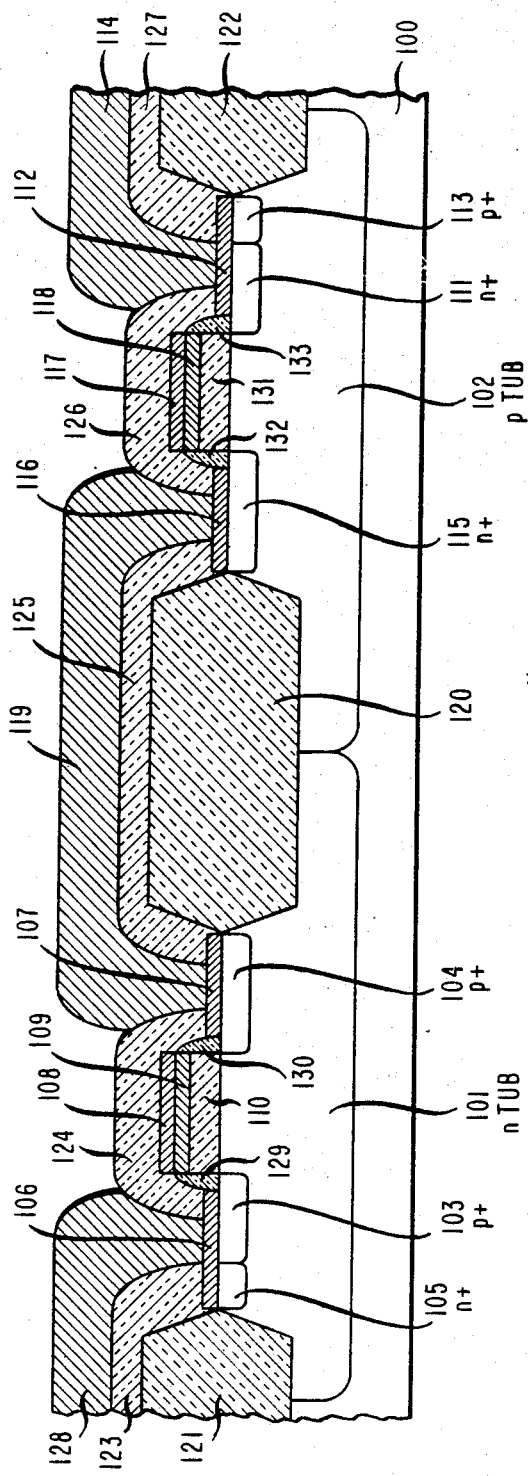
FIG. 1 shows a cross section of an integrated circuit substrate utilizing the inventive tub tie.

The following detailed description relates to an improved technique for forming an integrated circuit tub tie. Referring to FIG. 1, a cross section of a CMOS inverter utilizing the present technique is illustratively shown. A n tub 101 and p tub 102 are located in a silicon semiconductor body 100. As used herein, the term "tub" means a region formed in the silicon body that has a different conductivity type, or doping level (or both) than the bulk of the silicon body. The body 100 may be a single crystal silicon substrate, or silicon epitaxial layer, with polycrystalline silicon bodies also being possible. Formed in the n tub is a p channel transistor having p+ source region 103 and drain region 104. Adjacent to source region 103 is a n+ tub contact region 105. In the present technique a metal silicide layer 106 electrically connects source region 103 to the tub contact region 105, and hence to the n tub 101. The metal silicide layer is contacted by a conductor 128, typically aluminum, which connects to a positive power supply voltage, $V_{DD}$. Hence, both the n tub 101 and the source are placed at $V_{DD}$ in operation. Metal silicide layers 107 and 108 are also formed on the drain region 104 and polysilicon gate electrode 109, respectively. The gate electrode is insulated from the channel portion of the n tub by gate insulator 110, typically silicon dioxide, with sidewall spacers being optionally included when the lightly-doped drain technique is used to improve transistor reliability in the face of electric field induced degradation.

In the illustrative embodiment, the source 111 of the n channel transistor formed in p tub 102 is similarly connected by metal silicide layer 112 to the p+ tub contact region 113. Conductor 114 is connected to the negative power supply voltage $V_{SS}$, thereby placing both the source region 111 and the tub 102 at $V_{SS}$ in operation. Metal silicide layers 116 and 117 are formed on drain region 115 and polysilicon gate electrode 118, respectively. A conductor 119 connects the drain regions 104 and 115 of the p and n channel transistors, respectively. Isolation is provided by field oxide regions 120-122, and the conductors 128, 114, and 119 are insulated from underlying regions by glass layers 123-127.

A typical process sequence for forming the foregoing regions is as follows: The p and n tubs (101, 102) are formed in a silicon wafer, and the field oxide regions (120-122) formed. The gate oxide regions (110, 118) and n+ polysilicon gate electrodes (109, 117) are patterned. A n− lightly doped drain (LDD) implant is then accomplished for the n-channel transistor, and a p− LDD implant for the p-channel transistor. A silicon dioxide layer is then conformably deposited, and anisotropically etched to form the sidewall spacers (129, 130, 132, 133). The n+ and p+ source/drain implants for the n-channel and p-channel transistors are then accomplished, followed by a high- temperature anneal. The metal silicide layers 106, 107, 108, 112, 116 and 117 are then formed, by reacting the exposed silicon surfaces of the corresponding regions with a metal. The metal is typically refractory, and in the preferred embodiment is titanium, with others being possible, including tantalum, molybdenum, tungsten, and cobalt.

A typical process known in the art for forming the metal silicide is as follows: A 1000 angstrom (0.1 micrometer) thick layer of titanium was firstly blanket deposited over the regions previously formed on the substrate. A silicon ion beam implant was then accomplished at a 110 keV beam energy, $1 \times 10^{15}$ ions/cm$^3$ dose. This mixes silicon atoms with the native oxide on the titanium/silicon substrate interface, thereby providing for more consistent formation of the silicide. The titanium was then rapidly thermal annealed at 625 degrees C. for 60 seconds in a nitrogen atmosphere, by exposure to a flashlamp. This formed titanium silicide in those regions where the deposited titanium contacted exposed silicon, being the source/drain regions, the tub contact regions, and the gates. The titanium was selectively removed from the other regions (e.g., from over the field oxide and the gate sidewall spacers) by etching in a solution of phosphoric acid and hydrogen peroxide for 9 minutes at 80 degrees C. The silicide was again rapidly thermal annealed in nitrogen, at 900 degrees C. for 20 seconds, for improved resistivity. Following the silicide formation, a glass layer was deposited, and windows formed therein, producing regions 123-127. An aluminum layer was then deposited and patterned, forming conductor regions 114, 119 and 128. Still other layers, for example additional dielectric and conductor layers, and oxide or nitride cap layers, may be deposited as desired.

Figure 2:
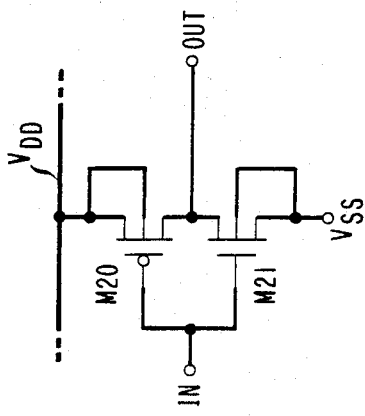
FIG. 2 shows schematically the tub tie connections in a CMOS inverter.

A schematic of the complementary inverter formed as above is shown in FIG. 2. However, the present technique may be applied to transistors in any circuit. Furthermore, it is not necessary in some cases to connect the sources of both n and p channel transistors to their respective tubs. For example, in a single tub process wherein the p-channel devices are located in n tubs formed in a p type substrate, only the sources of the p-channel devices may need be connected to their tubs. Even then, it is not necessary in some cases to connect all of the p-channel devices to their tubs. Note also that the present technique does not require opening a contact window at all in order to form the tub tie. For example, a tub tie may be provided for a given number of transistors, and contact windows opened over a fewer number of tub ties, in order to save space. Finally, although the foregoing has been illustrated using insulated gate (e.g., CMOS) technology, it may also be used for other types, including junction field effect transistor technology.

What is claimed is:

1. An integrated circuit having a first transistor formed in a doped first tub region of a first conductivity type formed in a silicon body of a given conductivity type, with the source of said first transistor being electrically connected by means of a first tub tie to said first tub region, and with a dielectric layer overlying at least a portion of said first transistor, characterized in that said first tub tie is a metal silicide that contacts said silicon body from said source to an adjacent heavily doped contact region of said first conductivity type formed entirely within said first tub region;

and wherein a first contact window is formed in said dielectric layer, and a metal first power supply conductor extends into said first window and physically contacts said first tub tie.

2. The integrated circuit of claim 1 wherein said metal silicide is also formed on the drain and gate of the first transistor.

3. The integrated circuit of claim 1 wherein said metal silicide is titanium silicide.

4. The integrated circuit of claim 1 wherein said metal silicide is selected from the group consisting of tantalum silicide, molybdenum silicide, and tungsten silicide.

5. The integrated circuit of claim 1 wherein said first tub region has the opposite conductivity type as the bulk of said semiconductor body.

6. The integrated circuit of claim 5 further comprising a second tub region having the same conductivity type and a different dopant concentration as the bulk of said semiconductor body.

7. The integrated circuit of claim 1 wherein said first window is the same size as a window formed in said dielectric region over the drain of said at least one of the transistors.

8. The integrated circuit of claim 1 wherein said conductor is aluminum.

9. The integrated circuit of claim 1 wherein a multiplicity of transistors are formed in said tub region, so as to have their sources connected by means of a metal silicide tub tie to an adjacent heavily doped contact region formed in said tub region, with the number of contact windows being less than said multiplicity of transistors, whereby the space devoted to contact windows is reduced.

10. The integrated circuit of claim 1 wherein said metal power supply conductor is an aluminum conductor.

11. The integrated circuit of claim 1 further comprising a doped second tub region of a second conductivity type opposite to said first conductivity type, with said second tub region abutting said first tub region at a boundary, and still further comprising a field oxide isolation region formed on said boundary at the surface of said silicon body.

12. The integrated circuit of claim 11 wherein a second transistor is formed in said second tub region, with the source of said second transistor being electrically connected by means of a second tub tie to said second tub region, wherein said second tub tie is a metal silicide that contacts said silicon body from the source of said second transistor to an adjacent heavily doped contact region of said second conductivity type formed entirely within said second tub region.

13. The integrated circuit of claim 12 wherein said dielectric layer overlies at least a portion of said second transistor, wherein a second contact window is formed in said dielectric layer, and a metal second power supply conductor extends into said second window and physically contacts said second tub tie.

* * * * *